United States Patent
Oka et al.

(10) Patent No.: US 12,446,392 B2
(45) Date of Patent: Oct. 14, 2025

(54) PHOTOVOLTAIC CELL DEVICE

(71) Applicant: Japan Display Inc., Tokyo (JP)

(72) Inventors: Shinichiro Oka, Tokyo (JP); Koichi Igeta, Tokyo (JP); Yasuyuki Yamada, Tokyo (JP); Hiroumi Kinjo, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 2 days.

(21) Appl. No.: 18/346,277

(22) Filed: Jul. 3, 2023

(65) Prior Publication Data

US 2024/0015993 A1    Jan. 11, 2024

(30) Foreign Application Priority Data

Jul. 5, 2022   (JP) ................. 2022-108479

(51) Int. Cl.
*H10K 30/87* (2023.01)
*G02F 1/1337* (2006.01)
*H10K 30/50* (2023.01)

(52) U.S. Cl.
CPC ....... *H10K 30/87* (2023.02); *G02F 1/133753* (2013.01); *H10K 30/50* (2023.02)

(58) Field of Classification Search
CPC ... H10K 30/87; H10K 30/50; G02F 1/133753
See application file for complete search history.

(56) References Cited

U.S. PATENT DOCUMENTS

| | | | |
|---|---|---|---|
| 6,518,944 B1* | 2/2003 | Doane | G02F 1/13318 |
| | | | 345/87 |
| 2003/0081158 A1* | 5/2003 | Li | G02F 1/13306 |
| | | | 349/113 |
| 2016/0033698 A1 | 2/2016 | Escuti et al. | |
| 2020/0271842 A1* | 8/2020 | Yoshida | G02F 1/133553 |

FOREIGN PATENT DOCUMENTS

| | | | |
|---|---|---|---|
| JP | H06252434 A | * | 9/1994 |
| JP | 2017-522601 A | | 8/2017 |

OTHER PUBLICATIONS

Nagashima, JP H06252434 A, Machine Translation (Year: 1994).*

* cited by examiner

*Primary Examiner* — Devina Pillay
(74) *Attorney, Agent, or Firm* — XSENSUS LLP

(57) ABSTRACT

According to one embodiment, a photovoltaic cell device includes a transparent substrate including a first main surface and a second main surface opposed to the first main surface, a liquid crystal layer disposed on the second main surface side of the transparent substrate and including a cholesteric liquid crystal including liquid crystal molecules, and photovoltaic cells disposed on at least one of the first main surface side and the second main surface side of the transparent substrate, each formed into a strip shape, and arranged with a predetermined gap between the photovoltaic cells.

7 Claims, 17 Drawing Sheets

$$\alpha = \sin^{-1}(\lambda/T) \cdots (1)$$
$$L = 2d \times \tan(\alpha) \cdots (2)$$
$$L > G \cdots (3)$$

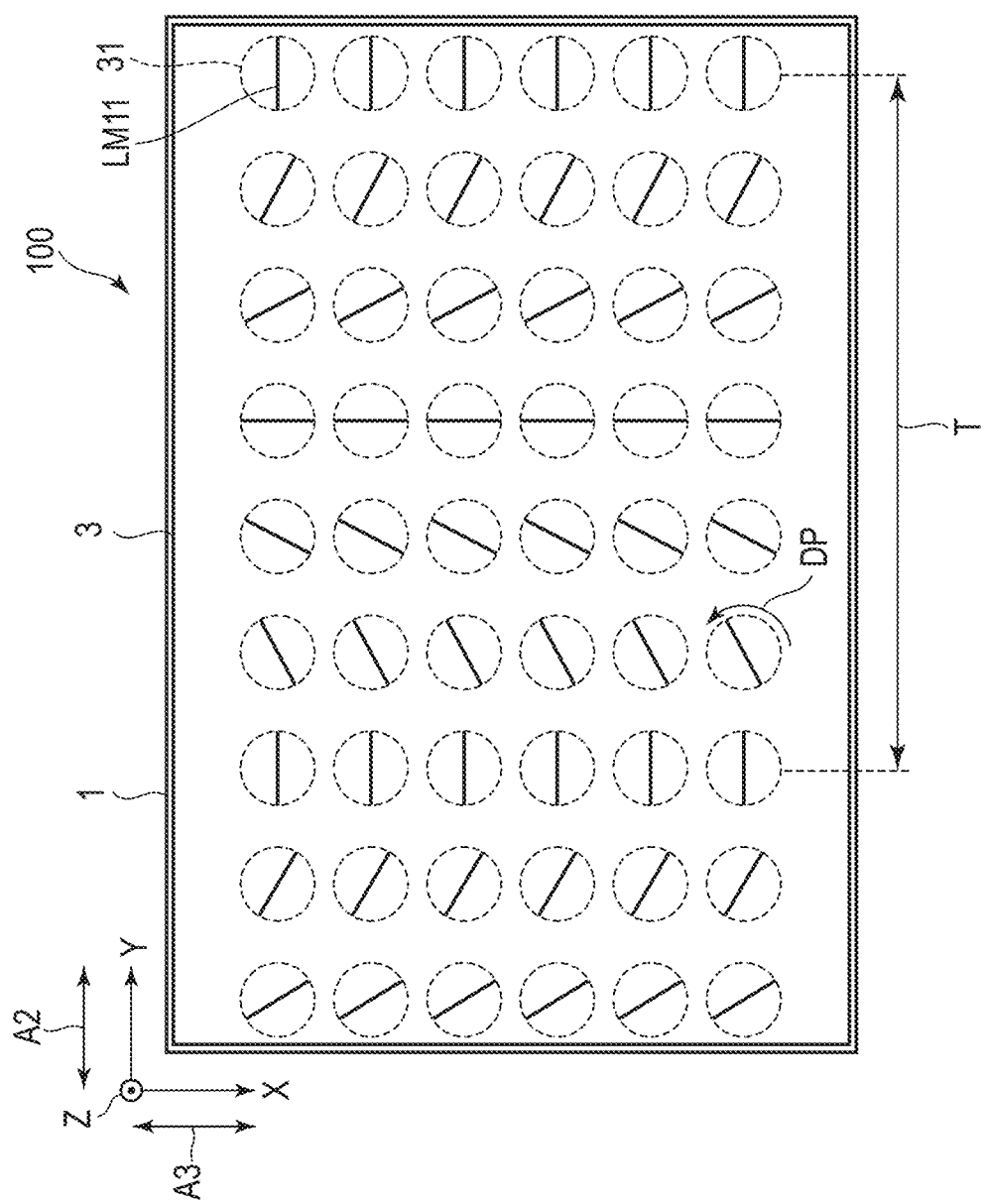
F I G. 4

PHOTOVOLTAIC CELL DEVICE

CROSS-REFERENCE TO RELATED APPLICATIONS

This application is based upon and claims the benefit of priority from Japanese Patent Application No. 2022-108479, filed Jul. 5, 2022, the entire contents of which are incorporated herein by reference.

FIELD

Embodiments described herein relate generally to a photovoltaic cell device.

BACKGROUND

For example, liquid crystal polarization gratings for which liquid crystal materials are used have been proposed. In such liquid crystal polarization gratings, in order to achieve desired reflective performance, it is necessary to adjust various parameters such as the grating cycle T, the refractive anisotropy Δn of a liquid crystal layer (difference between the refractive index ne for extraordinary light and the refractive index no for ordinary light of the liquid crystal layer), and the thickness d of the liquid crystal layer.

BRIEF DESCRIPTION OF THE DRAWINGS

FIG. 4 is a plan view schematically showing the liquid crystal optical element 100.

DETAILED DESCRIPTION

Figure 1:
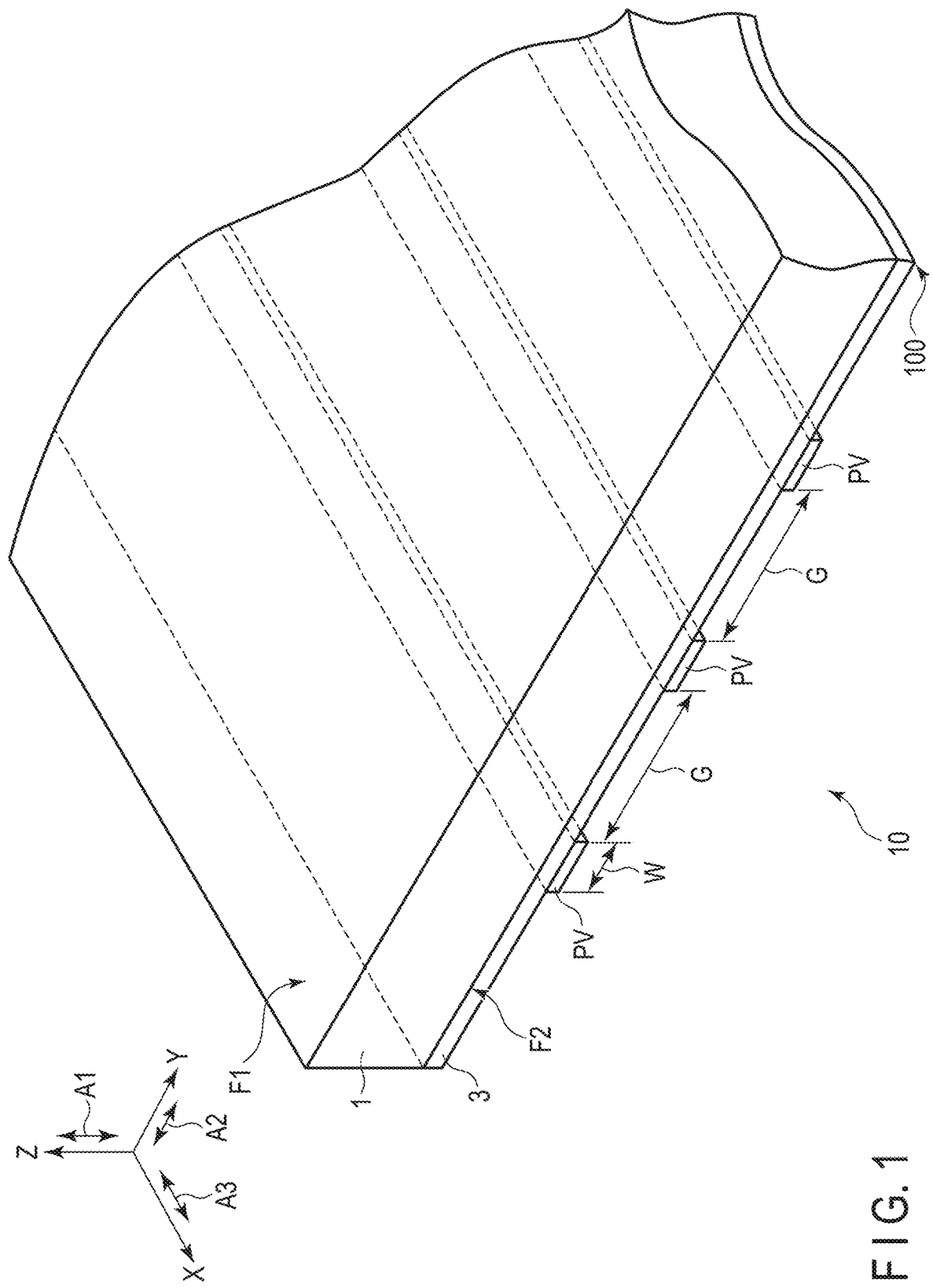
FIG. 1 is a perspective view showing an example of a photovoltaic cell device 10.

In general, according to one embodiment, a photovoltaic cell device comprises a transparent substrate comprising a first main surface and a second main surface opposed to the first main surface, a liquid crystal layer disposed on the second main surface side of the transparent substrate and comprising a cholesteric liquid crystal including liquid crystal molecules, and photovoltaic cells disposed on at least one of the first main surface side and the second main surface side of the transparent substrate, each formed into a strip shape, and arranged with a predetermined gap between the photovoltaic cells.

Embodiments will be described hereinafter with reference to the drawings. The disclosure is merely an example, and proper changes within the spirit of the invention which are easily conceivable by a person having ordinary skill in the art are included in the scope of the present invention as a matter of course. In addition, in order to make the description clearer, the width, thickness, shape, etc., of each portion may be schematically illustrated in the drawings, compared those in the actual modes, but they are mere examples and do not limit the interpretation of the present invention. In the specification and drawings, the structural elements that have the same or similar functions as or to those described in connection with preceding drawings are denoted by the same reference symbols, and a detailed description thereof may be omitted as appropriate.

In the drawings, an X-axis, a Y-axis, and a Z-axis orthogonal to each other are shown to facilitate understanding as necessary. A direction along the Z-axis is referred to as a Z direction or a first direction A1, a direction along the Y-axis is referred to as a Y direction or a second direction A2, and a direction along the X-axis is referred to as an X direction or a third direction A3. A plane defined by the X-axis and the Y-axis is referred to as an X-Y plane, a plane defined by the X-axis and the Z-axis is referred to as an X-Z plane, and a plane defined by the Y-axis and the Z-axis is referred to as a Y-Z plane.

FIG. 1 is a perspective view showing an example of a photovoltaic cell device 10.

The photovoltaic cell device 10 comprises a liquid crystal optical element 100 and photovoltaic cells PV. The liquid crystal optical element 100 comprises a transparent substrate 1 and a liquid crystal layer 3. The liquid crystal optical element 100 may comprise an alignment film between the transparent substrate 1 and the liquid crystal layer 3, which is not shown in FIG. 1. In addition, the liquid crystal optical element 100 may comprise an adhesive layer between the liquid crystal layer 3 and the photovoltaic cells PV.

The transparent substrate 1 is composed of, for example, a transparent glass plate or a transparent synthetic resin plate. The transparent substrate 1 may be composed of, for example, a transparent synthetic resin plate having flexibility. The transparent substrate 1 can assume an arbitrary shape. For example, the transparent substrate 1 may be curved.

In the present specification, "light" includes visible light and invisible light. For example, the wavelength of the lower limit of the visible light range is greater than or equal to 360 nm but less than or equal to 400 nm, and the wavelength of the upper limit of the visible light range is greater than or equal to 760 nm but less than or equal to 830 nm. Visible light includes a first component (blue component) of a first wavelength band (for example, 400 nm to 500 nm), a second component (green component) of a second wavelength band (for example, 500 nm to 600 nm), and a third component (red component) of a third wavelength band (for example, 600 nm to 700 nm). Invisible light includes ultraviolet rays of a wavelength band shorter than the first wavelength band and infrared rays of a wavelength band longer than the third wavelength band.

In the present specification, to be "transparent" should preferably be to be colorless and transparent. Note that to be "transparent" may be to be translucent or to be colored and transparent.

The transparent substrate 1 is formed into the shape of a flat plate along the X-Y plane, and comprises a first main surface F1 and a second main surface F2. The first main surface F1 and the second main surface F2 are surfaces substantially parallel to the X-Y plane and are opposed to each other in the first direction A1.

The liquid crystal layer 3 is disposed on the second main surface F2 side of the transparent substrate 1. Details of the liquid crystal layer 3 will be described later.

The photovoltaic cells PV are disposed on at least one of the first main surface F1 side of the transparent substrate 1 and the second main surface F2 side of the transparent substrate 1. In addition, the photovoltaic cells PV are each formed into a strip shape, and are arranged with a predetermined gap therebetween. In the example shown in the figure, the photovoltaic cells PV each extend in the third direction A3, and are arranged with a constant gap G therebetween in the second direction A2. That is, the second direction A2 corresponds to the short-side direction of the photovoltaic cell PV, and the third direction A3 corresponds to the long-side direction of the photovoltaic cell PV. For example, the width W in the short-side direction of the photovoltaic cell PV is less than or equal to the gap G.

The example shown in the figure corresponds to an example in which the photovoltaic cells PV are disposed on the second main surface F2 side of the transparent substrate 1. Each of the photovoltaic cells PV is disposed to be in contact with the liquid crystal layer 3. That is, the photovoltaic cells PV are opposed to the transparent substrate 1 with the liquid crystal layer 3 interposed therebetween. As a technique of providing the photovoltaic cells PV on the liquid crystal optical element 100, the photovoltaic cells PV manufactured separately may be attached to the liquid crystal layer 3, or the photovoltaic cells PV may be directly formed on the liquid crystal layer 3 by applying a material to the surface of the liquid crystal layer 3.

Examples of the photovoltaic cells PV include silicon photovoltaic cells, organic thin-film photovoltaic cells, etc. The silicon photovoltaic cells are formed with amorphous silicon, microcrystalline silicon, monocrystalline silicon, polycrystalline silicon, etc. The organic thin-film photovoltaic cells include organic semiconductor photovoltaic cells, perovskite photovoltaic cells, etc., and may have optical transparency depending on the material used.

Figure 2:
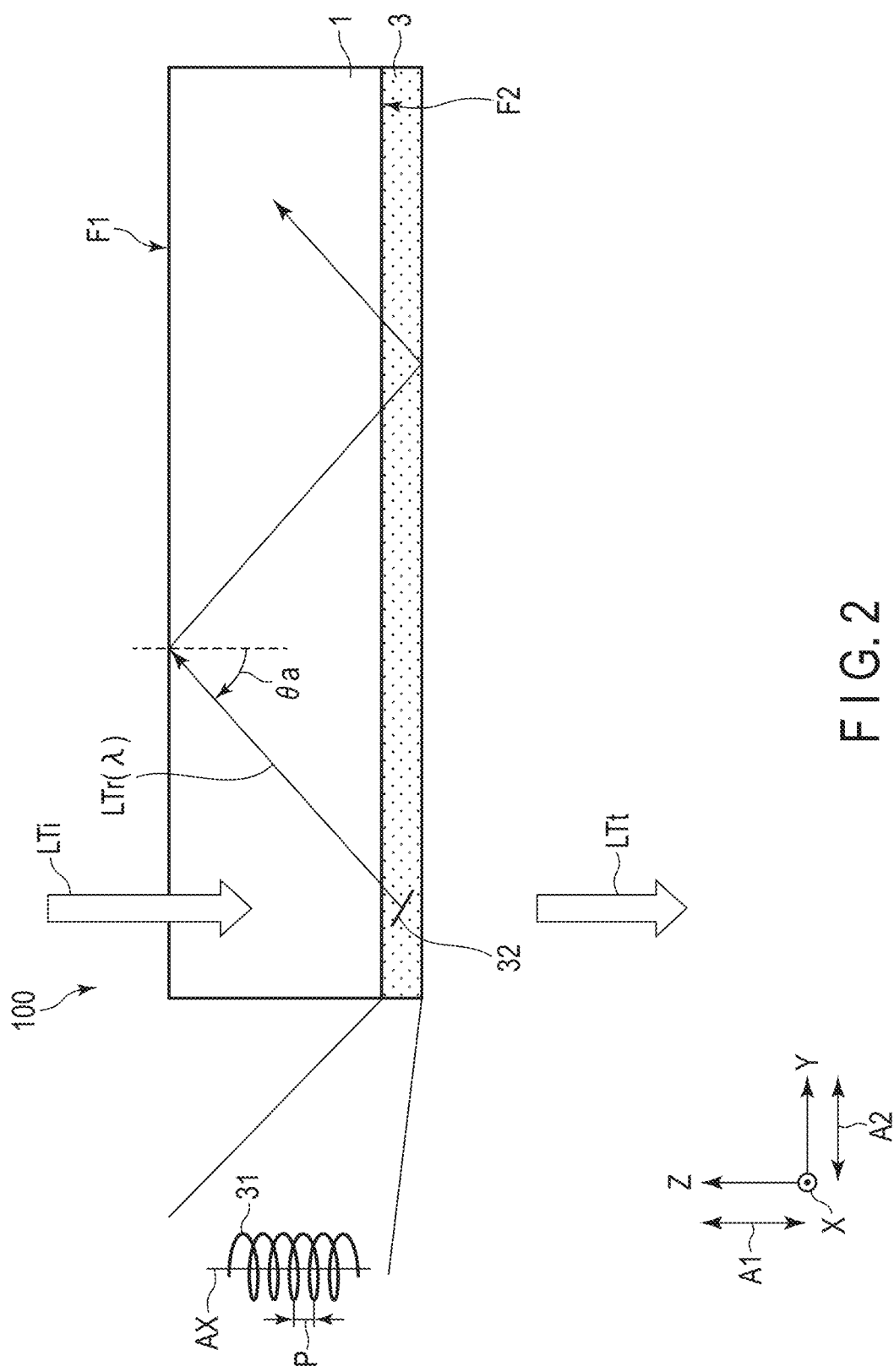
FIG. 2 is a cross-sectional view schematically showing a liquid crystal optical element 100.

FIG. 2 is a cross-sectional view schematically showing the liquid crystal optical element 100. In this figure, the photovoltaic cells PV shown in FIG. 1 are omitted.

The liquid crystal layer 3 comprises a cholesteric liquid crystal 31 as schematically shown in an enlarged manner. The cholesteric liquid crystal 31 has a helical axis AX substantially parallel to the first direction A1 and has a helical pitch P in the first direction A1. The helical pitch P indicates one cycle of the helix (layer thickness along the helical axis AX necessary for liquid crystal molecules to rotate 360 degrees).

The liquid crystal layer 3 reflects circularly polarized light of a selective reflection band determined according to the helical pitch P and the refractive anisotropy Δn, of light LTi incident through the transparent substrate 1. In the present specification, "reflection" in the liquid crystal layer 3 involves diffraction inside the liquid crystal layer 3.

In the liquid crystal layer 3, the cholesteric liquid crystal 31 comprises a reflective surface 32 which reflects circularly polarized light corresponding to the turning direction of the cholesteric liquid crystal 31, of the selective reflection band. In the present specification, circularly polarized light may be precise circularly polarized light or may be circularly polarized light approximate to elliptically polarized light.

The optical action of the liquid crystal optical element 100 will be described next.

The example shown in the figure illustrates a case where the liquid crystal layer 3 reflects at least part of light LTi incident from the transparent substrate 1 side toward the transparent substrate 1.

Light LTi incident on the liquid crystal optical element 100 includes, for example, visible light, ultraviolet rays, and infrared rays.

To facilitate understanding, it is herein assumed that light LTi is incident substantially perpendicularly to the transparent substrate 1. The angle of incidence of light LTi to the transparent substrate 1 is not particularly limited.

Light LTi enters the inside of the transparent substrate 1 from the first main surface F1, is emitted from the second main surface F2, and is incident on the liquid crystal layer 3. Then, the liquid crystal layer 3 reflects part of light LTi at the reflective surface 32 toward the transparent substrate 1 and transmits the other light. Reflected light LTr is circularly polarized light of a wavelength λ. For example, the wavelength λ is in the wavelength band of infrared rays. Light LTt transmitted through the liquid crystal layer 3 includes, for example, visible light V.

The angle θa of entry at which light LTr reflected by the liquid crystal layer 3 enters the transparent substrate 1 is set to satisfy the conditions for optical waveguide in the transparent substrate 1. The angle θa of entry here corresponds to an angle greater than or equal to the critical angle which causes total reflection at the interface between the transparent substrate 1 and the air. The angle θa of entry represents an angle to a perpendicular line orthogonal to the first main surface F1 of the transparent substrate 1.

If the transparent substrate 1 and the liquid crystal layer 3 have equivalent refractive indices, the stacked layer body of these can be a single optical waveguide body. In this case, light LTr is guided while being repeatedly reflected by the interface between the transparent substrate 1 and the air and the interface between the liquid crystal layer 3 and the air.

Figure 3:
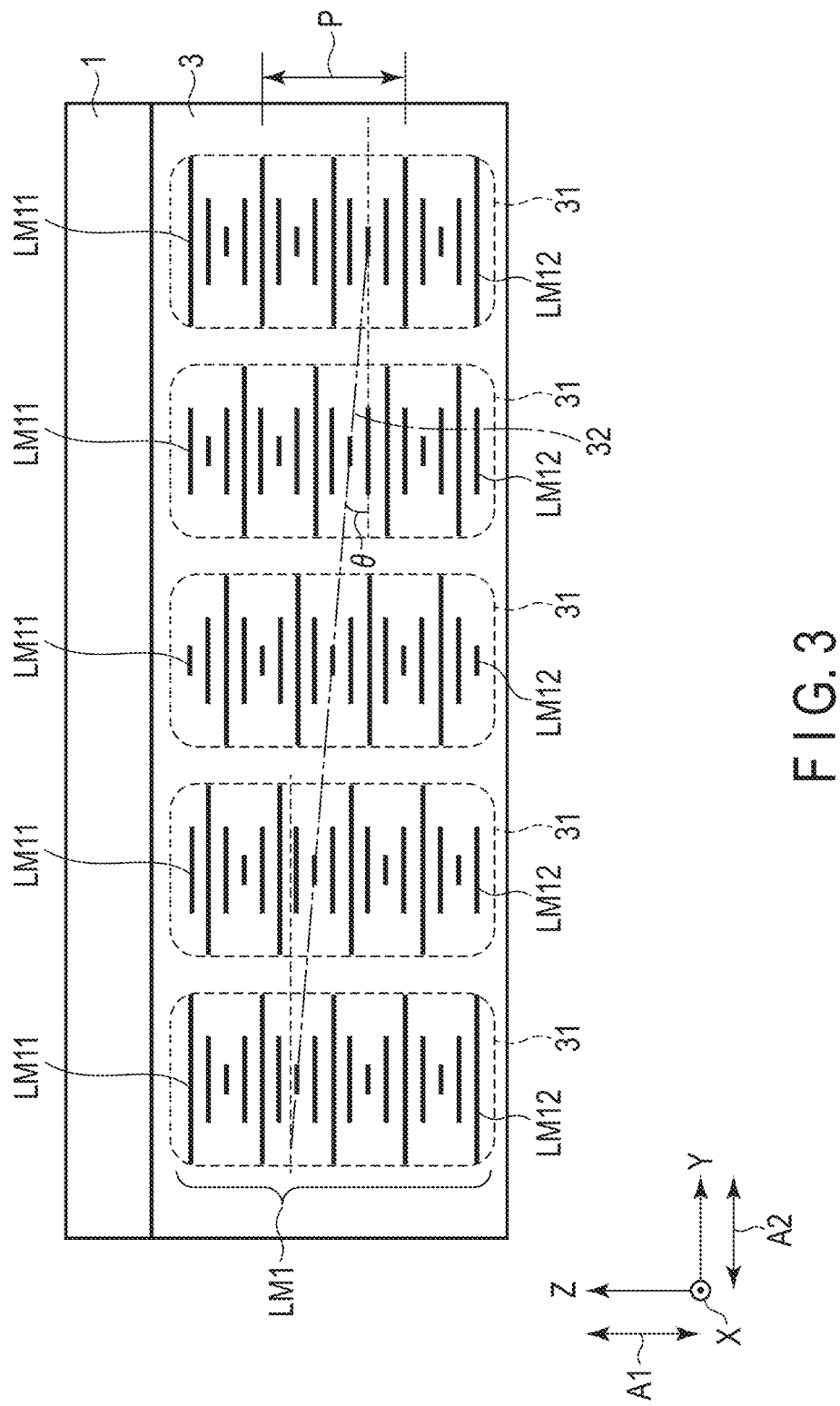
FIG. 3 is a diagram for explaining an example of cholesteric liquid crystals 31 included in a liquid crystal layer 3.

FIG. 3 is a diagram for explaining an example of cholesteric liquid crystals 31 included in the liquid crystal layer 3.

In FIG. 3, the liquid crystal layer 3 is shown in a state of being enlarged in the first direction A1. In addition, for the sake of simplification, one liquid crystal molecule LM1 of the liquid crystal molecules located in the same plane parallel to the X-Y plane is shown in the figure as liquid crystal molecules LM1 constituting the cholesteric liquid crystals 31. The alignment direction of the liquid crystal molecule LM1 shown in the figure corresponds to the average alignment direction of the liquid crystal molecules located in the same plane.

Each cholesteric liquid crystal 31 enclosed by a broken line is constituted of liquid crystal molecules LM1 helically stacked in the first direction A1 while being turned. The liquid crystal molecules LM1 comprise a liquid crystal molecule LM11 on one end side of the cholesteric liquid crystals 31 and a liquid crystal molecule LM12 on the other end side of the cholesteric liquid crystals 31. The liquid crystal molecule LM11 is close to the transparent substrate 1.

In the liquid crystal layer 3, the alignment directions of the cholesteric liquid crystals 31 adjacent to each other in the second direction A2 are different from each other. In addition, the spatial phases of the cholesteric liquid crystals 31 adjacent to each other in the second direction A2 are different from each other.

The alignment directions of the liquid crystal molecules LM11 adjacent to each other in the second direction A2 are different from each other. The alignment directions of the liquid crystal molecules LM11 change continuously in the second direction A2.

The alignment directions of the liquid crystal molecules LM12 adjacent to each other in the second direction A2 are also different from each other. The alignment directions of the liquid crystal molecules LM12 also change continuously in the second direction A2.

The reflective surface 32 of the liquid crystal layer 3 indicated by an alternate long and short dashed line in the figure is inclined with respect to the X-Y plane. The angle formed by the reflective surface 32 and the X-Y plane is referred to as the angle θ of inclination of the reflective surface 32. The angle θ of inclination is an acute angle. The reflective surface 32 corresponds to a surface along which the alignment directions of the liquid crystal molecules LM1 are substantially identical or a surface along which the spatial phases are the same (equiphase wave surface).

The above-described liquid crystal layer 3 is cured in a state where the alignment directions of the liquid crystal molecules LM1 are fixed. That is, the alignment directions of the liquid crystal molecules LM1 are not controlled in accordance with an electric field. For this reason, the liquid crystal optical element 100 does not comprise an electrode for forming an electric field in the liquid crystal layer 3.

In general, in a liquid crystal layer comprising a cholesteric liquid crystal, a selective reflection band Δλ for perpendicularly incident light is expressed as equation (1) below, based on the helical pitch P of the cholesteric liquid crystal and the refractive anisotropy Δn (difference between the refractive index ne for extraordinary light and the refractive index no for ordinary light) of the liquid crystal layer.

$$\Delta\lambda = \Delta n * P \quad (1)$$

The specific wavelength range of the selective reflection band Δλ is greater than or equal to no*P but less than or equal to ne*P.

FIG. 4 is a plan view schematically showing the liquid crystal optical element 100.

FIG. 4 shows an example of the spatial phases of the cholesteric liquid crystals 31. The spatial phases here are shown as the alignment directions of the liquid crystal molecules LM11 located close to the transparent substrate 1 of the liquid crystal molecules LM1 included in the cholesteric liquid crystals 31.

The alignment directions of the liquid crystal molecules LM11 differ from each other between each cholesteric liquid crystal 31 arranged in the second direction A2. That is, the spatial phases of the cholesteric liquid crystals 31 are different in the second direction A2. The second direction A2 here corresponds to the short-side direction of the photovoltaic cells PV as described with reference to FIG. 1.

In contrast, the alignment directions of the liquid crystal molecules LM11 are substantially identical between each cholesteric liquid crystal 31 arranged in the third direction A3. That is, the spatial phases of the cholesteric liquid crystals 31 are substantially identical in the third direction A3. The third direction A3 here corresponds to the long-side direction of the photovoltaic cells PV as described with reference to FIG. 1.

In particular, in the cholesteric liquid crystals 31 arranged in the second direction A2, the respective alignment directions of the liquid crystal molecules LM11 differ by equal angles. That is, the alignment directions of the liquid crystal molecules LM11 arranged in the second direction A2 change linearly. Accordingly, the spatial phases of the cholesteric liquid crystals 31 arranged in the second direction A2 change linearly in the second direction A2. As a result, as in the liquid crystal layer 3 shown in FIG. 3, the reflective surface 32 inclined with respect to the X-Y plane is formed. The phrase "change linearly" here means, for example, that the amount of change of the alignment directions of the liquid crystal molecules LM11 is represented by a linear function. The alignment directions of the liquid crystal molecules LM11 here correspond to the major-axis directions of the liquid crystal molecules LM11 in the X-Y plane.

Here, in one plane, the interval between two liquid crystal molecules LM11 between which the alignment directions of the liquid crystal molecules LM11 change by 180 degrees in the second direction A2 is defined as a cycle T. In FIG. 4, DP denotes the turning direction of the liquid crystal molecules LM11. The angle θ of inclination of the reflective surface 32 shown in FIG. 3 is set as appropriate by the cycle T and the helical pitch P.

The preferable range of the gap G between the photovoltaic cells PV will be described here with reference to FIG. 5, on the assumption that the photovoltaic cells PV are disposed on the second main surface F2 side of the transparent substrate 1.

It is herein assumed that light LTi is incident along the normal N of the transparent substrate 1, and light transmitted through the liquid crystal optical element 100 is omitted from the figure and the description. The angle α of diffraction of light LTr reflected by the reflective surface 32 of the liquid crystal layer 3 is expressed as equation (1) in the figure, based on the wavelength λ of light LTr and the cycle T of the cholesteric liquid crystals 31.

When light LTr reflected by the reflective surface 32 is reflected by a first interface between the transparent substrate 1 and the air and then further reflected by a second interface between the liquid crystal layer 3 and the air, the length from the reflection position on the reflective surface 32 to the reflection position on the second interface is expressed as a total reflection length L. The total reflection length L is expressed as equation (2) in the figure, based on the total thickness d of the transparent substrate 1 and the liquid crystal layer 3 and the angle α of diffraction.

As indicated by inequality (3) in the figure, it is preferable that the gap G between the photovoltaic cells PV be smaller than the total reflection length L. This makes it possible to reduce the light guide distance of light LTr which is reflected by the reflective surface 32 and then guided to a photovoltaic cell PV or the number of times of reflection inside the liquid crystal optical element 100. This suppresses problems such as the scattering of light LTr due to foreign matter adhering to the transparent substrate 1 and the liquid crystal layer 3 or a minute crack and the leakage of light LTr to the outside of the liquid crystal optical element 100. Accordingly, this suppresses a loss when guiding light from the liquid crystal optical element 100 to the photovoltaic cells PV and suppresses a decline in power generation efficiency.

If the photovoltaic cells PV are not transparent, in order to improve the transmittance of the liquid crystal optical element 100, it is preferable that the width W of the photovoltaic cells PV be small and the gap G be small.

The photovoltaic cells PV generate power, receiving, for example, invisible light, especially infrared rays. It is therefore preferable that the gap G be set, for example, with the wavelength λ of light LTr assumed to be 700 nm.

Figure 6:
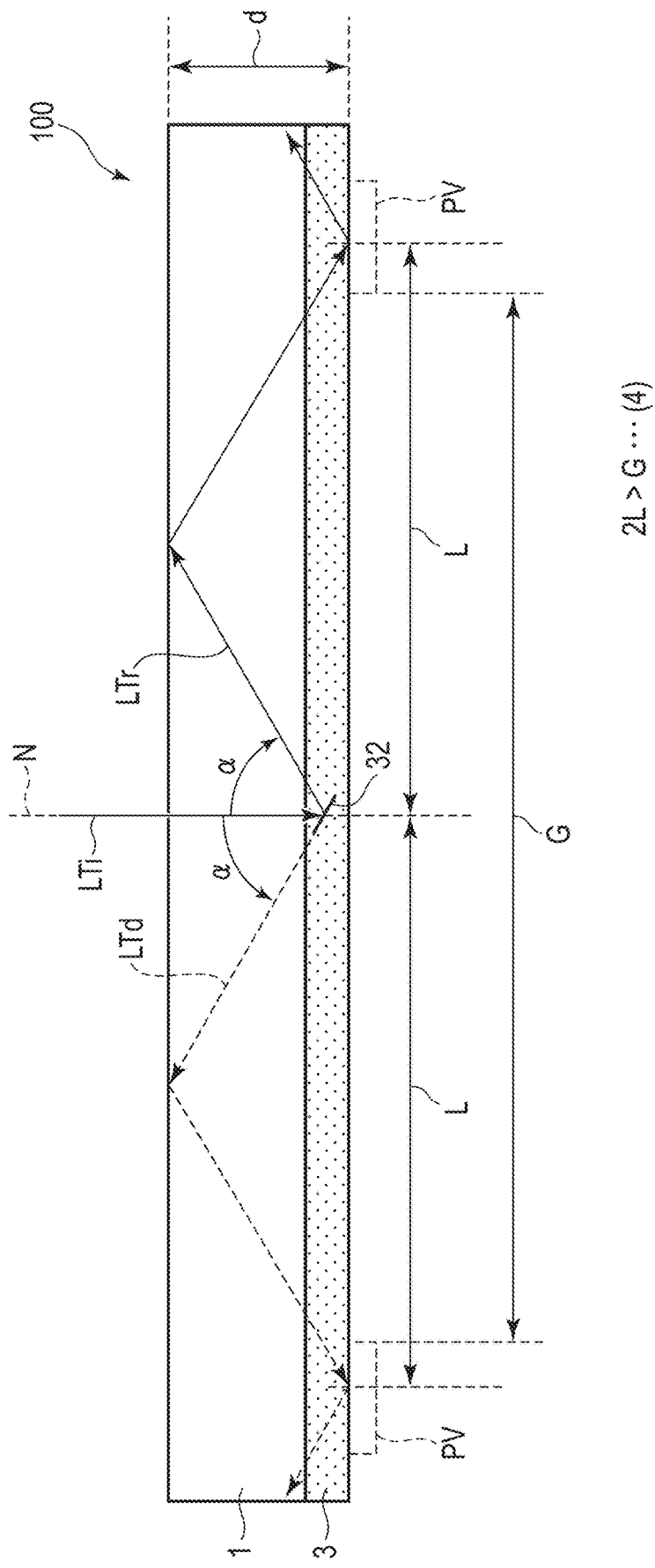
FIG. 6 is a diagram for explaining the range of the gap G between the photovoltaic cells PV from another point of view.

FIG. 6 is a diagram for explaining the range of the gap G between the photovoltaic cells PV from another point of view.

Figure 5:
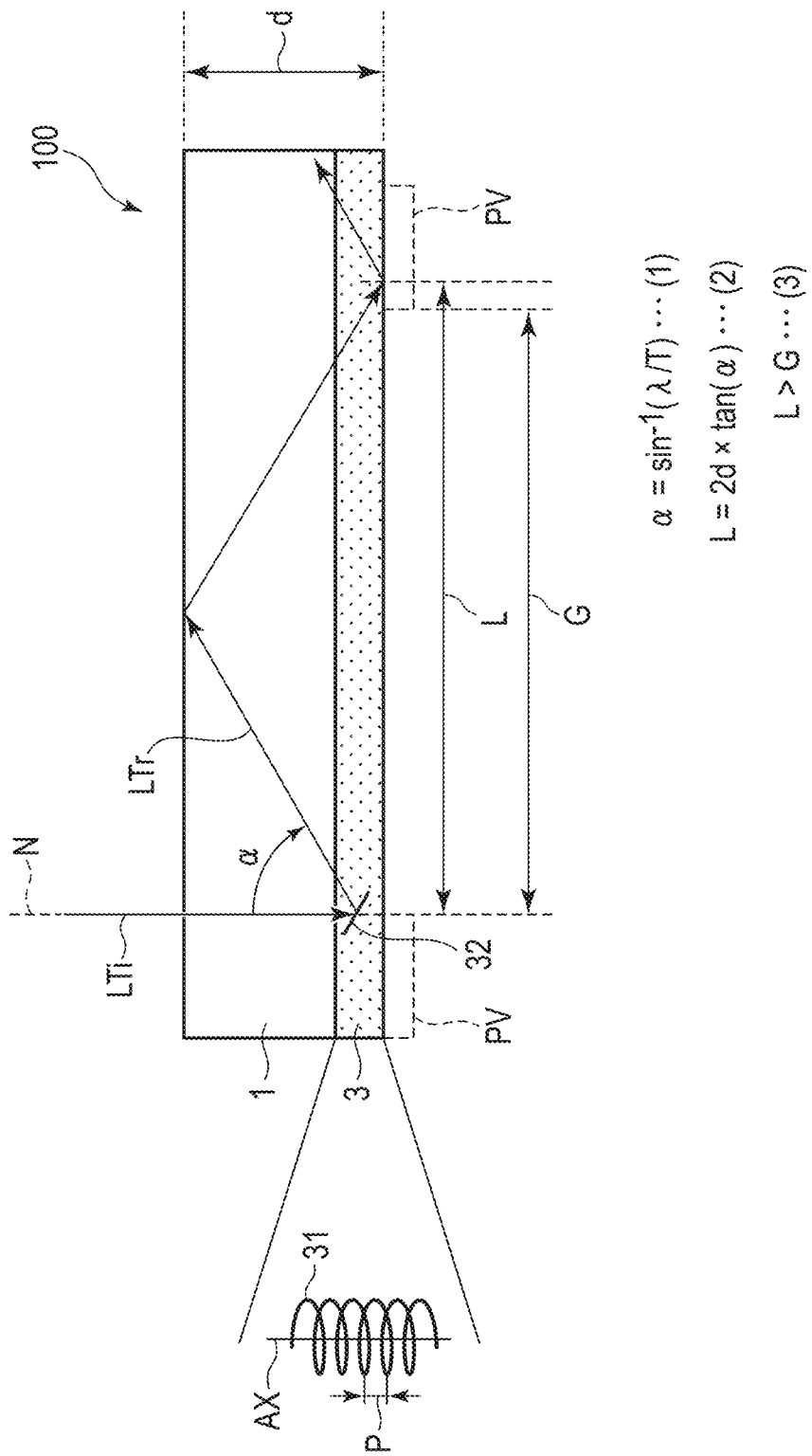
FIG. 5 is a diagram for explaining a gap G between photovoltaic cells PV shown in FIG. 1.

In the example shown in FIG. 5, it has been assumed that light LTi of the wavelength λ is reflected by the reflective surface 32 only in one direction (to the right side of the figure); whereas in the example shown in FIG. 6, it is assumed that light LTi is reflected by the reflective surface 32 in one direction (to the right side of the figure) and in addition, part of light LTi is diffracted in another direction (to the left side of the figure).

For example, when light LTd diffracted by the reflective surface 32 is reflected by the first interface between the transparent substrate 1 and the air and then further reflected by the second interface between the liquid crystal layer 3 and the air, the length from the diffraction position on the reflective surface 32 to the reflection position on the second interface is substantially equal to the total reflection length L, which has been described with reference to FIG. 5. The total reflection length L is expressed as equation (2) in the figure, based on the total thickness d of the transparent substrate 1 and the liquid crystal layer 3 and the angle α of diffraction.

As indicated by inequality (4) in the figure, it is preferable that the gap G between the photovoltaic cells PV be smaller than twice the total reflection length L.

Figure 7:
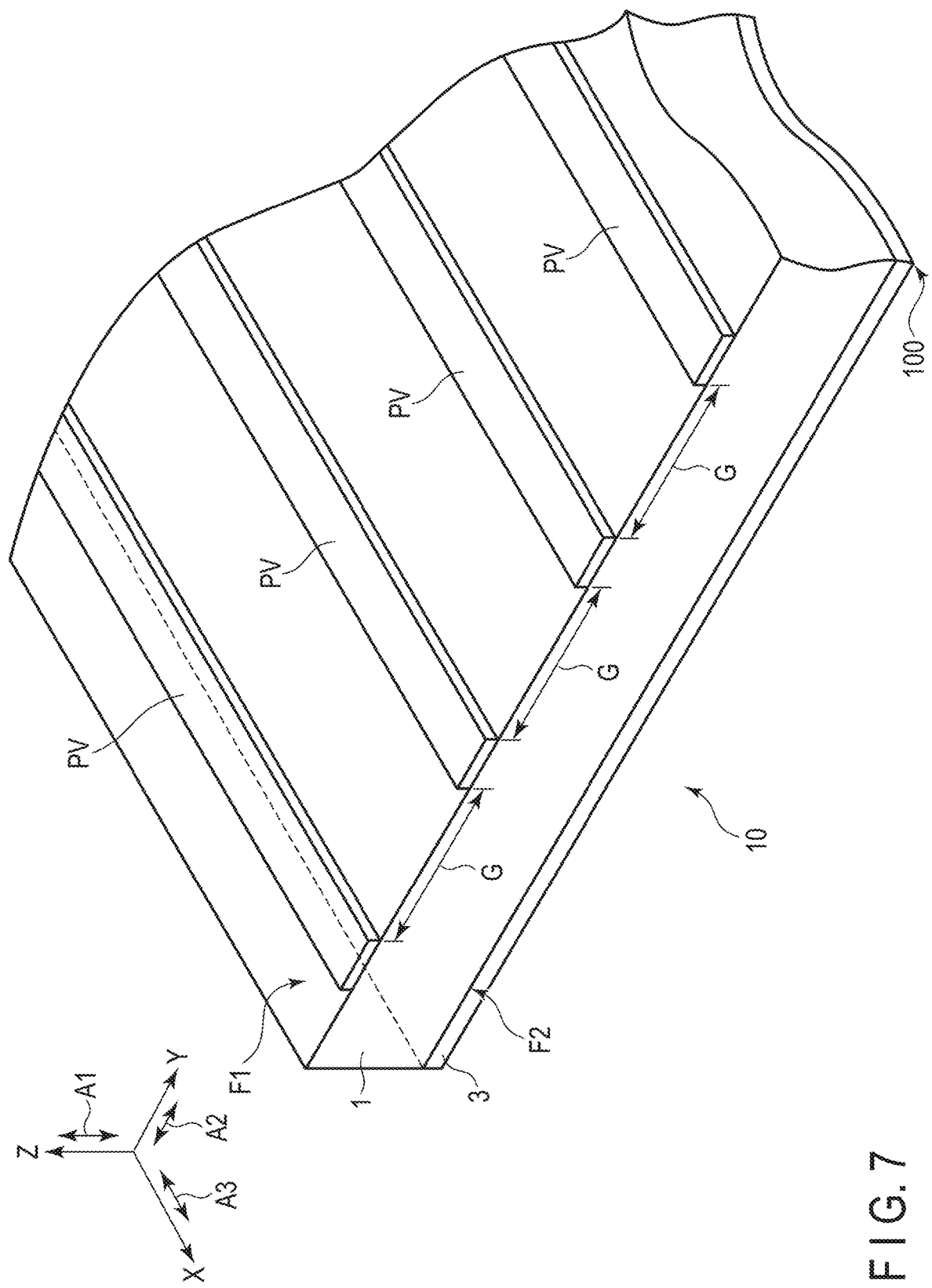
FIG. 7 is a perspective view showing another example of the photovoltaic cell device 10.

FIG. 7 is a perspective view showing another example of the photovoltaic cell device 10.

The example shown in FIG. 7 is different from the example shown in FIG. 1 in that the photovoltaic cells PV are disposed on the first main surface F1 side of the transparent substrate 1. Each of the photovoltaic cells PV is disposed to be in contact with the transparent substrate 1. As a technique of providing the photovoltaic cells PV on the liquid crystal optical element 100, the photovoltaic cells PV manufactured separately may be attached to the liquid crystal layer 3, or the photovoltaic cells PV may be directly formed on the liquid crystal layer 3 by applying a material to the surface of the liquid crystal layer 3.

The photovoltaic cells PV are each formed into a strip shape, and are arranged with a predetermined gap therebetween. In the example shown in the figure, the photovoltaic cells PV each extend in the third direction A3, and are arranged with a constant gap G therebetween in the second direction A2. That is, the second direction A2 corresponds to the short-side direction of the photovoltaic cell PV, and the third direction A3 corresponds to the long-side direction of the photovoltaic cell PV.

Figure 8:
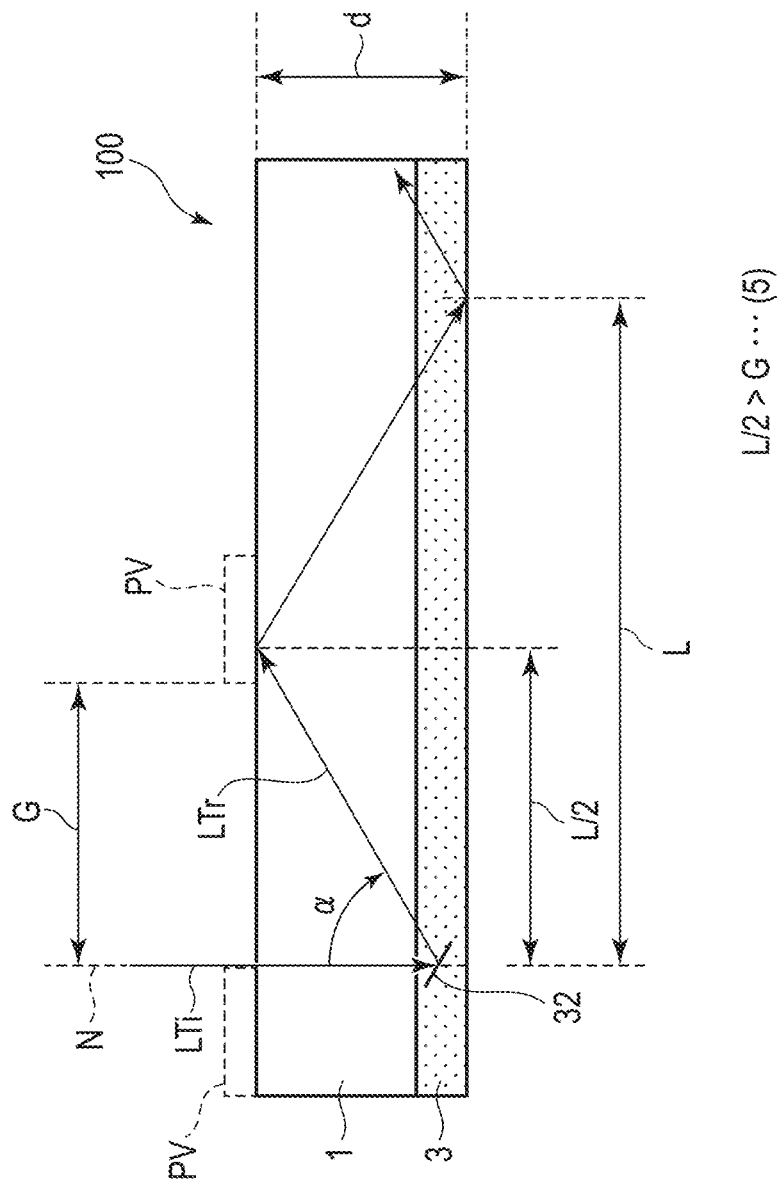
FIG. 8 is a diagram for explaining the gap G between the photovoltaic cells PV shown in FIG. 7.

The preferable range of the gap G between the photovoltaic cells PV will be described here with reference to FIG. 8, on the assumption that the photovoltaic cells PV are disposed on the first main surface F1 side of the transparent substrate 1.

It is herein assumed that light LTi is incident along the normal N of the transparent substrate 1, and light transmitted through the liquid crystal optical element 100 is omitted from the figure and the description. The angle α of diffraction of light LTr reflected by the reflective surface 32 of the liquid crystal layer 3 is expressed as equation (1), which has been described with reference to FIG. 5. In addition, the total reflection length L is expressed as equation (2), which has been described with reference to FIG. 5.

In this case, as indicated by inequality (5) in the figure, it is preferable that the gap G between the photovoltaic cells PV be smaller than half the total reflection length L. This makes it possible to reduce the light guide distance of light LTr which is reflected by the reflective surface 32 and then guided to a photovoltaic cell PV or the number of times of reflection inside the liquid crystal optical element 100. This suppresses a loss when guiding light from the liquid crystal optical element 100 to the photovoltaic cells PV and suppresses a decline in power generation efficiency as in the case of the above-described example.

Figure 9:
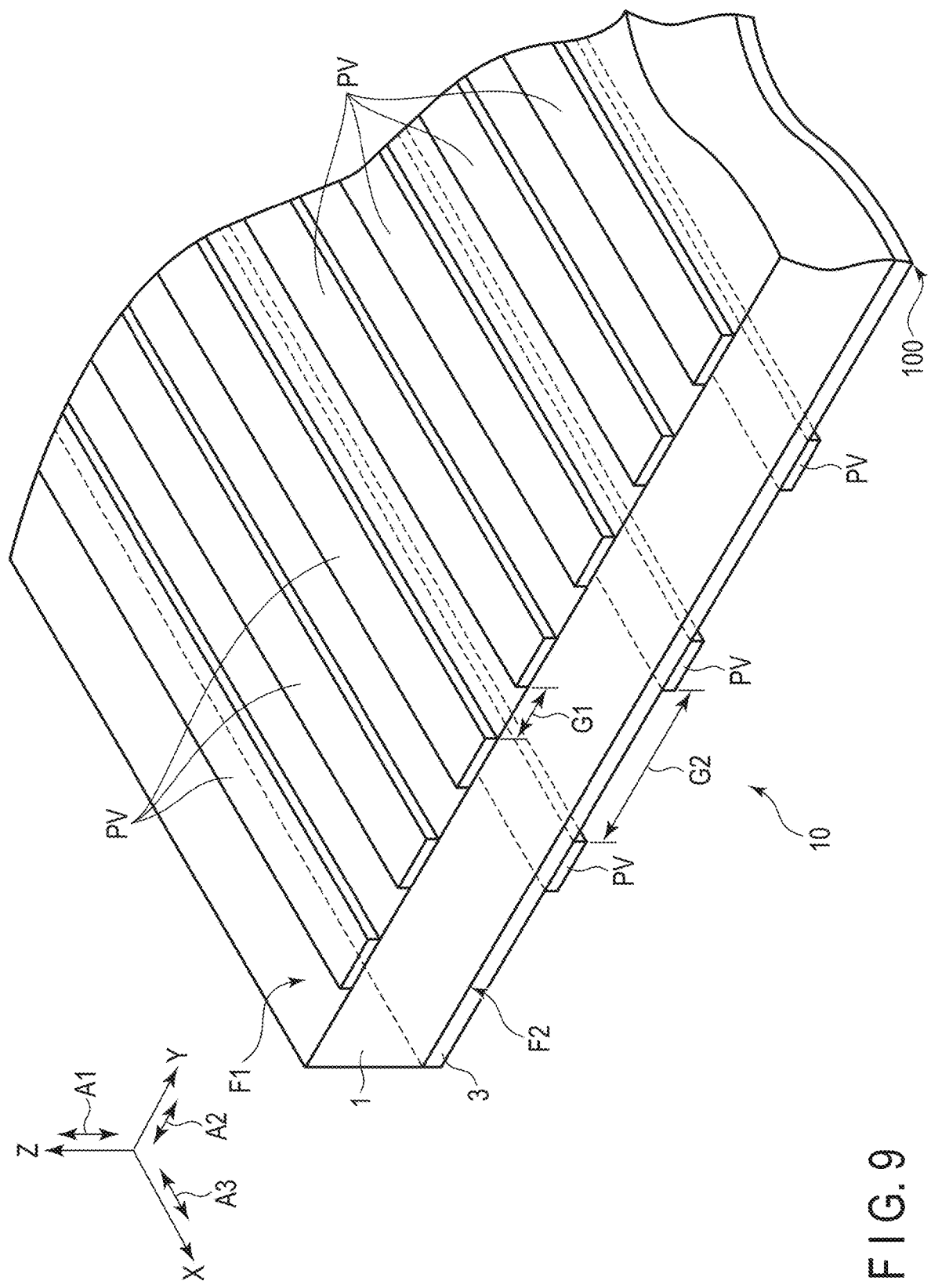
FIG. 9 is a perspective view showing another example of the photovoltaic cell device 10.

FIG. 9 is a perspective view showing another example of the photovoltaic cell device 10.

The example shown in FIG. 9 is different from the example shown in FIG. 1 in that the photovoltaic cells PV are disposed on each of the first main surface F1 side and the second main surface F2 side of the transparent substrate 1.

On the first main surface F1 side, each of the photovoltaic cells PV is disposed to be in contact with the transparent substrate 1. In addition, on the second main surface F2 side, each of the photovoltaic cells PV is disposed to be in contact with the liquid crystal layer 3, and is opposed to the transparent substrate 1 with the liquid crystal layer 3 interposed therebetween.

The photovoltaic cells PV are each formed into a strip shape, and are arranged with a predetermined gap therebetween. In the example shown in the figure, each of the photovoltaic cells PV extends in the third direction A3. The photovoltaic cells PV disposed on the first main surface F1 side are arranged with a constant gap G1 therebetween in the second direction A2. The photovoltaic cells PV disposed on the second main surface F2 side are arranged with a constant gap G2 therebetween in the second direction A2. It is preferable that the gap G1 be set on the basis of inequality (5), which has been described with reference to FIG. 8. In addition, it is preferable that the gap G2 be set on the basis of inequality (3), which has been described with reference to FIG. 5, or inequality (4), which has been described with reference to FIG. 6. Thus, the gap G1 is smaller than the gap G2 (G1<G2).

Modified examples of the liquid crystal optical element 100 will be described next.

Figure 10:
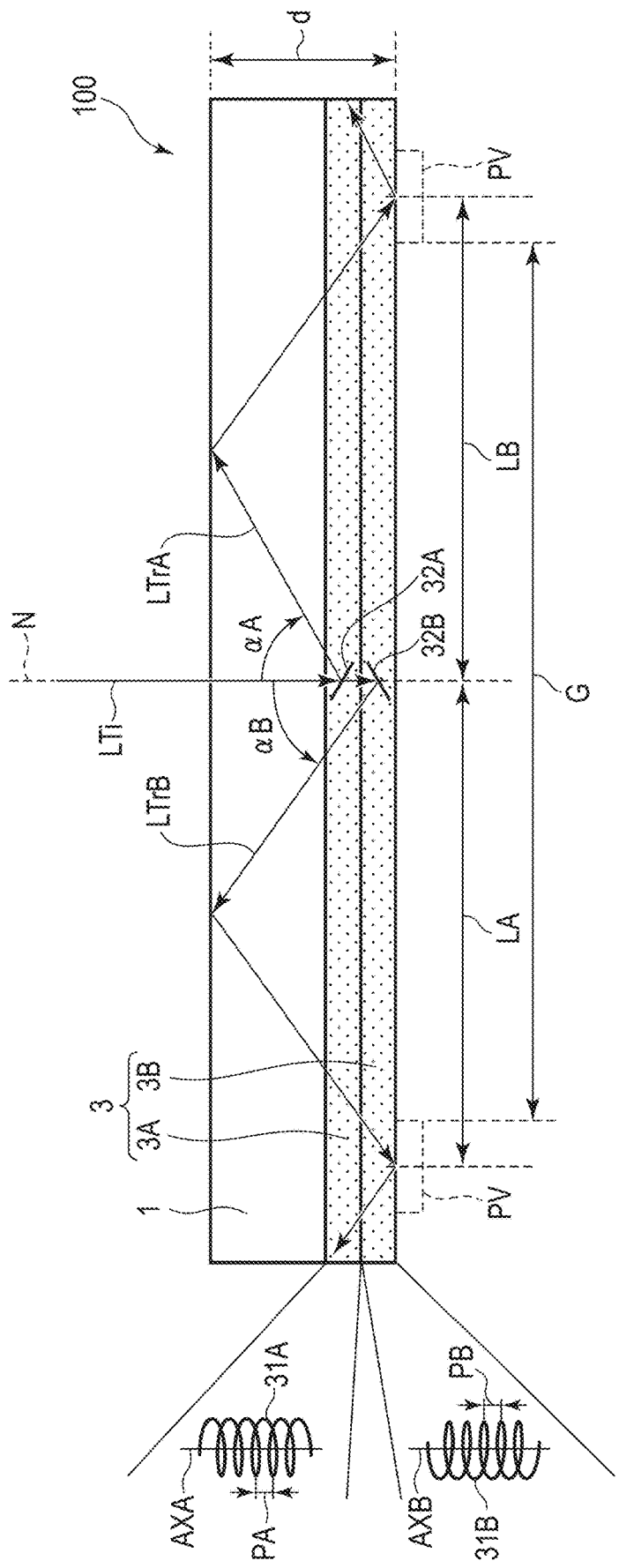
FIG. 10 is a cross-sectional view schematically showing a modified example of the liquid crystal optical element 100.

FIG. 10 is a cross-sectional view schematically showing a modified example of the liquid crystal optical element 100. The photovoltaic cells PV are indicated by broken lines in the figure.

The liquid crystal layer 3 comprises a first layer 3A and a second layer 3B. The first layer 3A is located between the transparent substrate 1 and the second layer 3B. The liquid crystal optical element 100 may comprise an alignment film between the transparent substrate 1 and the liquid crystal layer 3, which is not shown in the figure.

The first layer 3A and the second layer 3B comprise cholesteric liquid crystals 31A and 31B, respectively, as schematically shown in an enlarged manner. The cholesteric liquid crystal 31A has a helical axis AXA substantially parallel to the first direction A1, and has a helical pitch PA in the first direction A1. The cholesteric liquid crystal 31B has a helical axis AXB substantially parallel to the first direction A1, and has a helical pitch PB in the first direction A1. The helical axis AXA is parallel to the helical axis AXB. The helical pitch PA is equal to the helical pitch PB, but may be different from the helical pitch PB. The turning direction of the cholesteric liquid crystal 31A is opposite to the turning direction of the cholesteric liquid crystal 31B.

The direction of inclination of a reflective surface 32A of the first layer 3A is different from the direction of inclination of a reflective surface 32B of the second layer 3B. The reflective surface 32A is inclined to reflect incident light LTi to the right side of the figure. The reflective surface 32B is inclined to reflect incident light LTi to the left side of the figure.

The angle αA of diffraction of light LTrA reflected by the reflective surface 32A is equal to the angle αB of diffraction of light LTrB reflected by the reflective surface 32B, but may be different from the angle αB of diffraction. If the angle αA of diffraction is equal to the angle αB of diffraction, the total reflection length LA of light LTrA is equal to the total reflection length LB of light LTrB.

In the above-described modified example, it is preferable that the gap G between the photovoltaic cells PV be smaller than the total sum of the total reflection lengths LA and LB.

Figure 11:
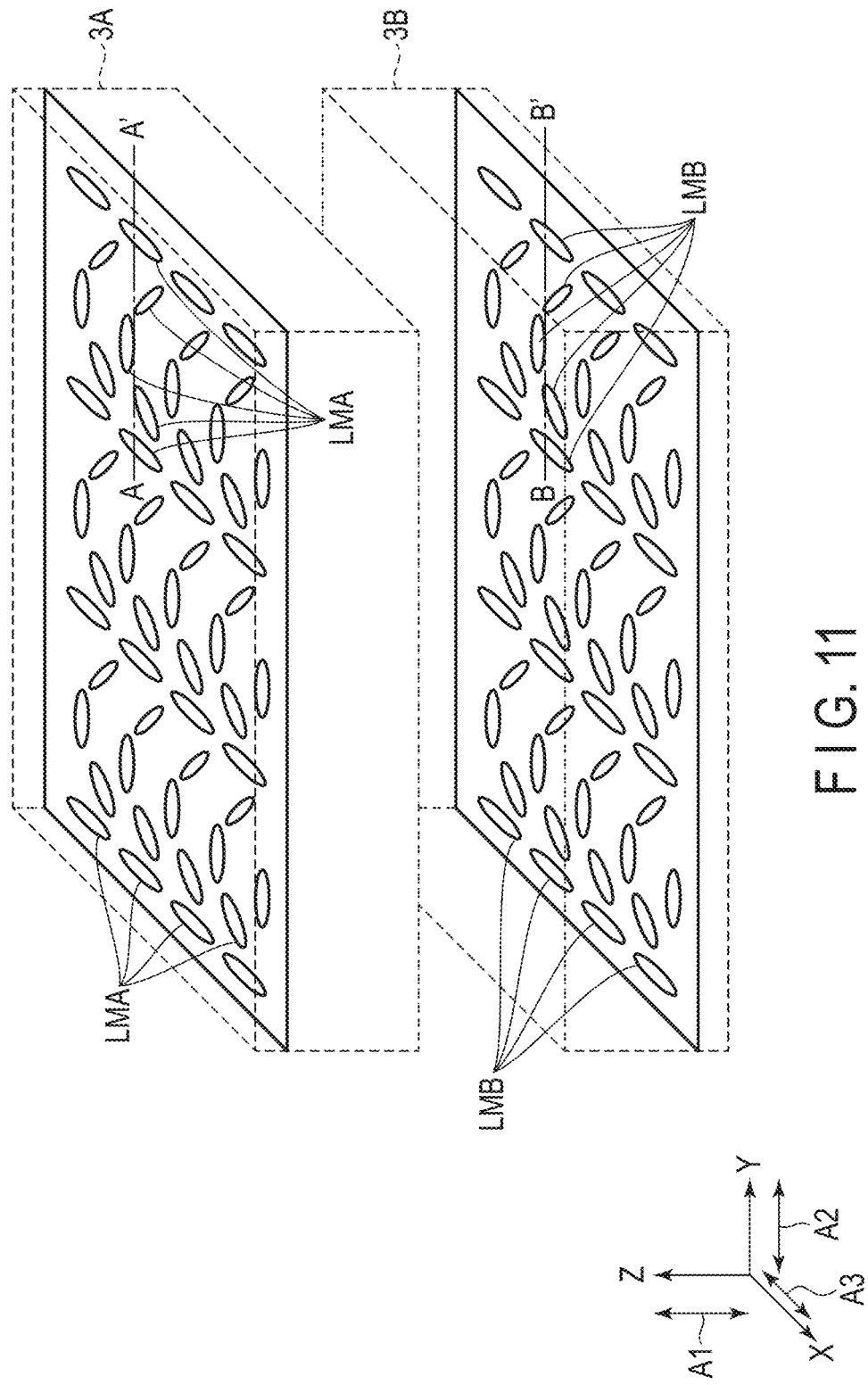
FIG. 11 is a diagram showing an example of the alignment pattern of liquid crystal molecules included in the liquid crystal layer 3 shown in FIG. 10.

FIG. 11 is a diagram showing an example of the alignment pattern of liquid crystal molecules included in the liquid crystal layer 3 shown in FIG. 10.

FIG. 11 shows the alignment pattern of liquid crystal molecules LMA arranged in one plane parallel to the X-Y plane of the liquid crystal molecules included in the first layer 3A, and shows the alignment pattern of liquid crystal molecules LMB arranged in one plane parallel to the X-Y plane of the liquid crystal molecules included in the second layer 3B.

In the first layer 3A, the respective alignment directions of the liquid crystal molecules LMA arranged in the second direction A2 are different from each other. For example, the respective alignment directions of five liquid crystal molecules LMA arranged along line A-A' change by equal angles clockwise in the second direction A2 (from the left to the right of the figure). The respective alignment directions of the liquid crystal molecules LMA arranged in the third direction A3 are substantially identical.

In the second layer 3B, the respective alignment directions of the liquid crystal molecules LMB arranged in the second direction A2 are different from each other. For example, the respective alignment directions of five liquid crystal molecules LMB arranged along line B-B' change by equal angles clockwise in the second direction A2 (from the left to the right of the figure). The respective alignment directions of the liquid crystal molecules LMB arranged in the third direction A3 are substantially identical.

An example of a manufacturing method of the above-described liquid crystal layer 3 will be described briefly hereinafter.

First, after an alignment film is formed on the transparent substrate 1, the alignment treatment of the alignment film is performed. Then, a first liquid crystal material for forming the cholesteric liquid crystal 31A is applied on the alignment film, and then, the first liquid crystal material is cured. The first layer 3A comprising the cholesteric liquid crystal 31A is thereby formed.

Then, a second liquid crystal material for forming the cholesteric liquid crystal 31B is applied on the first layer 3A. The second liquid crystal material includes a chiral agent different from that of the first liquid crystal material. Then, the second liquid crystal material is cured. The second layer 3B comprising the cholesteric liquid crystal 31B is thereby formed. The liquid crystal molecules LMB of the second layer 3B formed in this manner inherit the alignment pattern of the liquid crystal molecules LMA of the first layer 3A. Thus, the alignment pattern as shown in FIG. 11 is formed. Note that the turning direction of the cholesteric liquid crystal 31A is opposite to the turning direction of the cholesteric liquid crystal 31B. Thus, as shown in FIG. 10, the direction of inclination of the reflective surface 32A formed in the first layer 3A is different from the direction of inclination of the reflective surface 32B formed in the second layer 3B.

Figure 12:
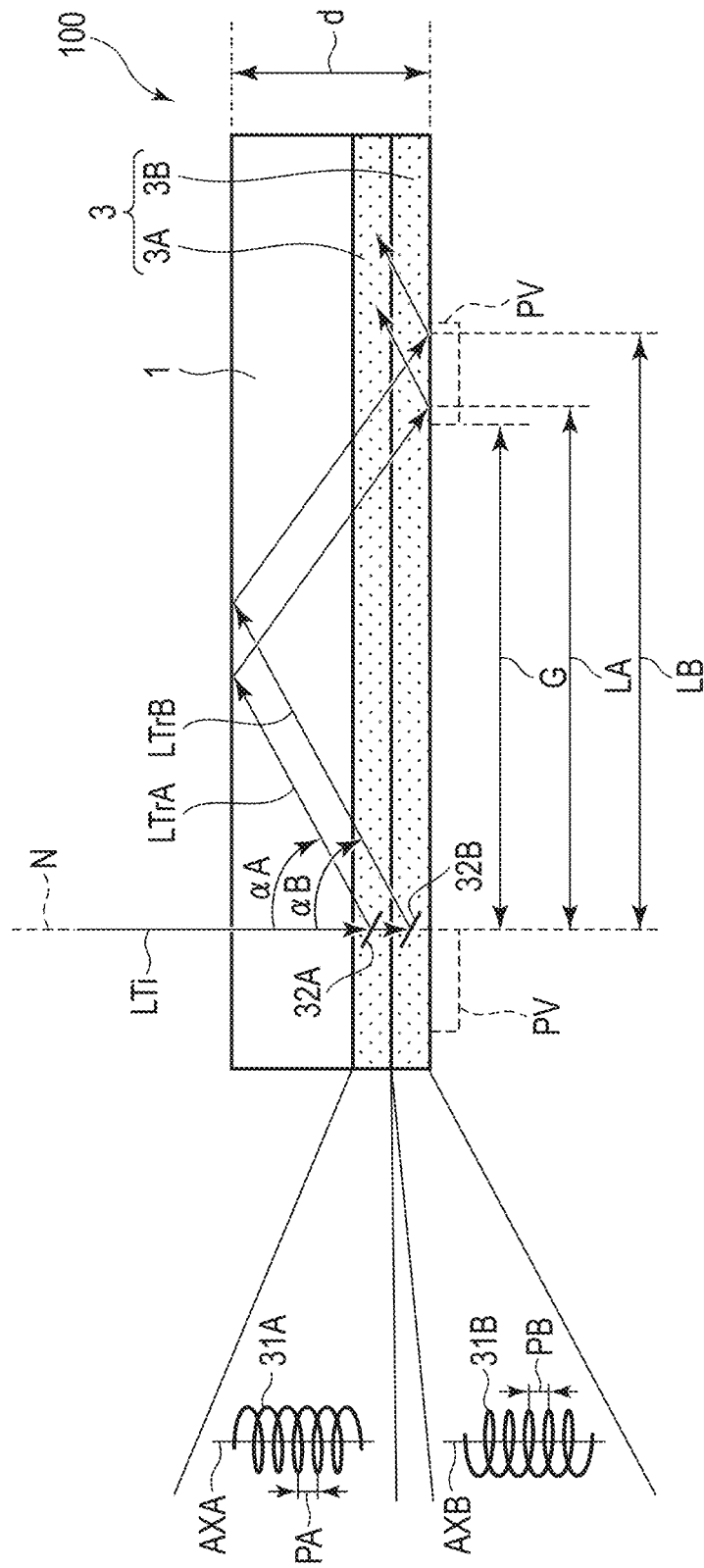
FIG. 12 is a cross-sectional view schematically showing another modified example of the liquid crystal optical element 100.

FIG. 12 is a cross-sectional view schematically showing another modified example of the liquid crystal optical element 100. The photovoltaic cells PV are indicated by broken lines in the figure.

The modified example shown in FIG. 12 is different from the modified example shown in FIG. 10 in that the reflective surface 32A and the reflective surface 32B are both inclined to reflect light LTi to the right side of the figure.

The first layer 3A of the liquid crystal layer 3 is located between the transparent substrate 1 and the second layer 3B, and comprises the cholesteric liquid crystal 31A. The cholesteric liquid crystal 31A has the helical axis AXA substantially parallel to the first direction A1, and has the helical pitch PA in the first direction A1.

The second layer 3B of the liquid crystal layer 3 comprises the cholesteric liquid crystal 31B. The cholesteric liquid crystal 31B has the helical axis AXB substantially parallel to the first direction A1, and has the helical pitch PB in the first direction A1. The helical axis AXA is parallel to the helical axis AXB. The helical pitch PA is equal to the helical pitch PB, but may be different from the helical pitch PB. The turning direction of the cholesteric liquid crystal 31A is opposite to the turning direction of the cholesteric liquid crystal 31B.

In the above-described modified example, it is preferable that the gap G between the photovoltaic cells PV be smaller than the total reflection length LA of light LTrA and be smaller than the total reflection length LB of light LTrB.

Figure 13:
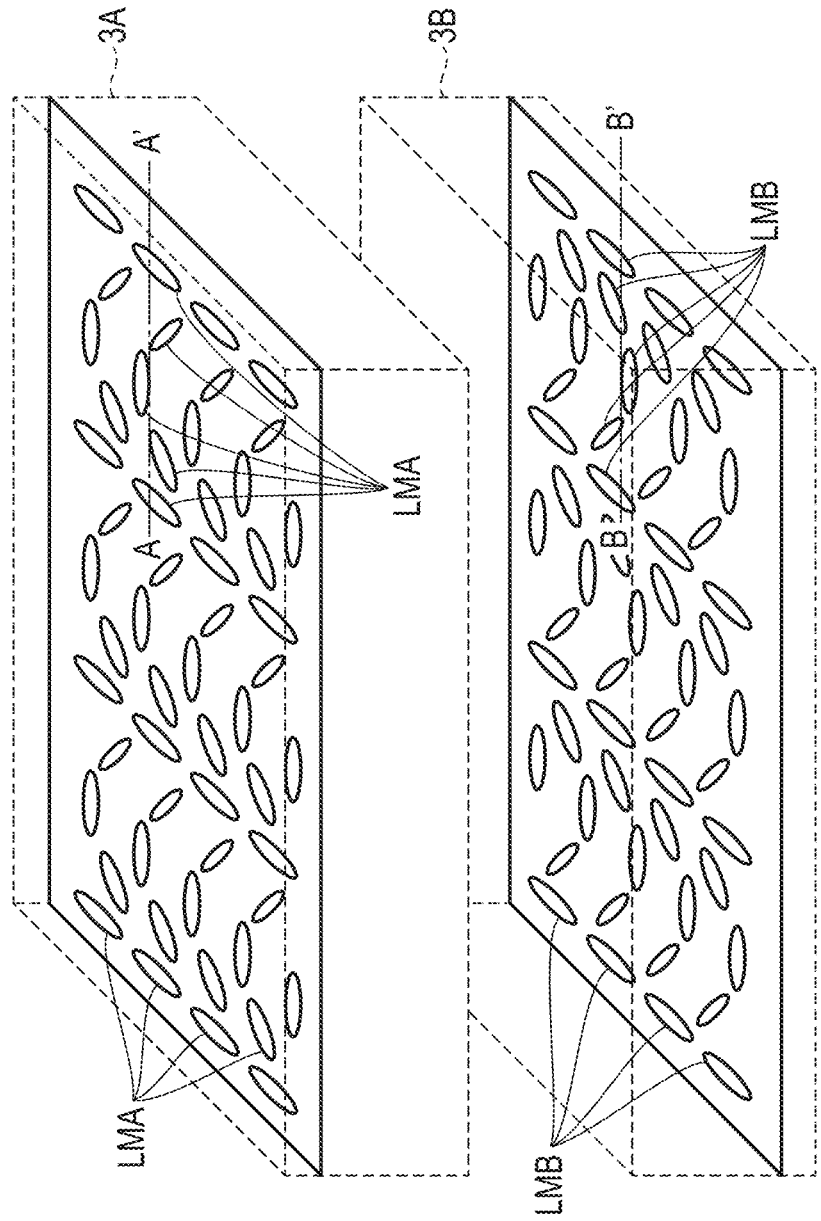
FIG. 13 is a diagram showing an example of the alignment pattern of liquid crystal molecules included in the liquid crystal layer 3 shown in FIG. 12.
Figure 13:
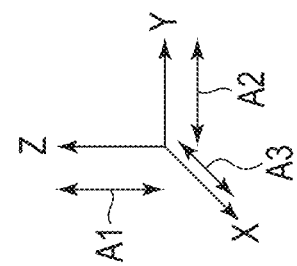

FIG. 13 is a diagram showing an example of the alignment pattern of liquid crystal molecules included in the liquid crystal layer 3 shown in FIG. 12.

FIG. 13 shows the alignment pattern of liquid crystal molecules LMA arranged in one plane parallel to the X-Y plane of the liquid crystal molecules included in the first layer 3A, and shows the alignment pattern of liquid crystal molecules LMB arranged in one plane parallel to the X-Y plane of the liquid crystal molecules included in the second layer 3B.

In the first layer 3A, the respective alignment directions of the liquid crystal molecules LMA arranged in the second direction A2 are different from each other. For example, the respective alignment directions of five liquid crystal molecules LMA arranged along line A-A' change by equal angles clockwise in the second direction A2 (from the left to the right of the figure). The respective alignment directions of the liquid crystal molecules LMA arranged in the third direction A3 are substantially identical.

In the second layer 3B, the respective alignment directions of the liquid crystal molecules LMB arranged in the second direction A2 are different from each other. For example, the respective alignment directions of five liquid crystal molecules LMB arranged along line B-B' change by equal angles counterclockwise in the second direction A2 (from the left to the right of the figure). The respective alignment directions of the liquid crystal molecules LMB arranged in the third direction A3 are substantially identical.

An example of a manufacturing method of the above-described liquid crystal layer 3 will be described briefly hereinafter.

First, after an alignment film is formed on the transparent substrate 1, the alignment treatment of the alignment film is performed. Then, a first liquid crystal material for forming the cholesteric liquid crystal 31A is applied on the alignment film, and then, the first liquid crystal material is cured. The first layer 3A comprising the cholesteric liquid crystal 31A is thereby formed.

On the other hand, after an alignment film is formed on a support body prepared separately, the alignment treatment of the alignment film is performed. Then, a second liquid crystal material for forming the cholesteric liquid crystal 31B is applied on the alignment film, and then, the second liquid crystal material is cured. The second layer 3B comprising the cholesteric liquid crystal 31B is thereby formed. Then, only the second layer 3B is peeled from the support body, and the second layer 3B is attached to the first layer 3A.

In this manner, the liquid crystal molecules LMB of the second layer 3B, which is formed separately from the first layer 3A, can have an alignment pattern different from that of the liquid crystal molecules LMA of the first layer 3A. Thus, the alignment pattern as shown in FIG. 13 is formed.

In the modified examples described with reference to FIG. 10 to FIG. 13, the liquid crystal layer 3 comprises the first layer 3A and the second layer 3B. If the helical pitch PA of the cholesteric liquid crystal 31A is equal to the helical pitch PB of the cholesteric liquid crystal 31B and the turning direction of the cholesteric liquid crystal 31A is opposite to the turning direction of the cholesteric liquid crystal 31B, the reflectance of light LTr of the same wavelength λ of light LTi incident on the liquid crystal optical element 100 improves. For example, if the turning direction of the cholesteric liquid crystal 31A is right-handed and the turning direction of the cholesteric liquid crystal 31B is left-handed, the reflective surface 32A of the cholesteric liquid crystal 31A reflects right-handed circularly polarized light of the light of the wavelength A, and the reflective surface 32B of the cholesteric liquid crystal 31B reflects left-handed circularly polarized light of the light of the wavelength A. For this reason, as compared to those in the example explained with reference FIG. 2, etc., the reflectance at the liquid crystal layer 3 improves and the power generation efficiency in the photovoltaic cells PV improves.

The liquid crystal layer 3 may be a stacked layer body of three or more layers. In addition, the liquid crystal layer 3 may include layers having different helical pitches.

The modified examples described with reference to FIG. 10 to FIG. 13 can be applied to, not only a case where the photovoltaic cells PV are disposed on the second main surface F2 side, but also a case where the photovoltaic cells PV are disposed on the first main surface F1 side or a case where the photovoltaic cells PV are disposed on both the first main surface F1 and the second main surface F2.

Variations of the photovoltaic cell device 10 will be described next with reference to FIG. 14 to FIG. 18.

Figure 14:
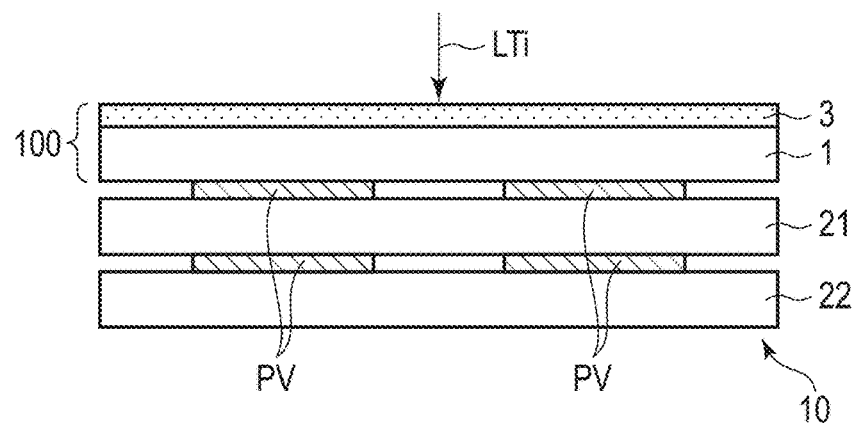
FIG. 14 is a diagram showing a variation of the photovoltaic cell device 10.

In the example shown in FIG. 14, the photovoltaic cell device 10 comprises protective substrates 21 and 22 in addition to the liquid crystal optical element 100 and the photovoltaic cells PV. The protective substrate 21 is located between the liquid crystal optical element 100 and the protective substrate 22. The protective substrates 21 and 22 are both transparent substrates and are glass plates or synthetic resin plates. The liquid crystal layer 3 of the liquid crystal optical element 100 faces the side on which light LTi is incident. The photovoltaic cells PV are located between the transparent substrate 1 and the protective substrate 21, and are also located between the protective substrate 21 and the protective substrate 22.

The photovoltaic cells PV are thereby protected. In addition, light which has not been able to be used for power generation by the photovoltaic cells PV between the transparent substrate 1 and the protective substrate 21 can be used for power generation by the photovoltaic cells PV between the protective substrate 21 and the protective substrate 22.

Figure 15:
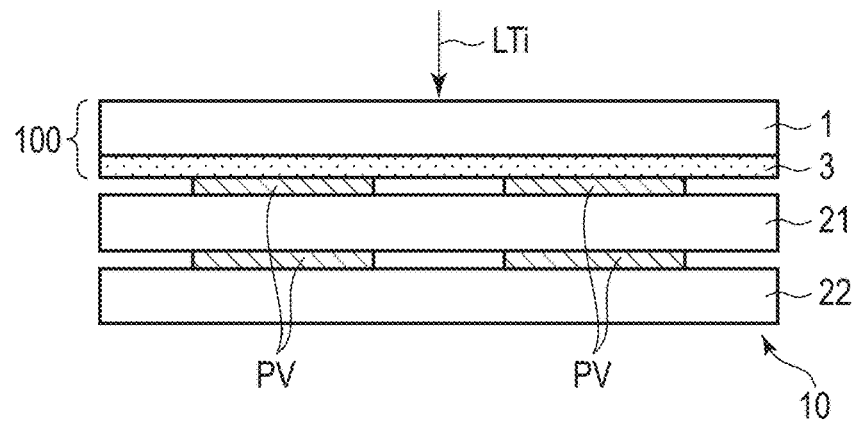
FIG. 15 is a diagram showing a variation of the photovoltaic cell device 10.
Figure 16:
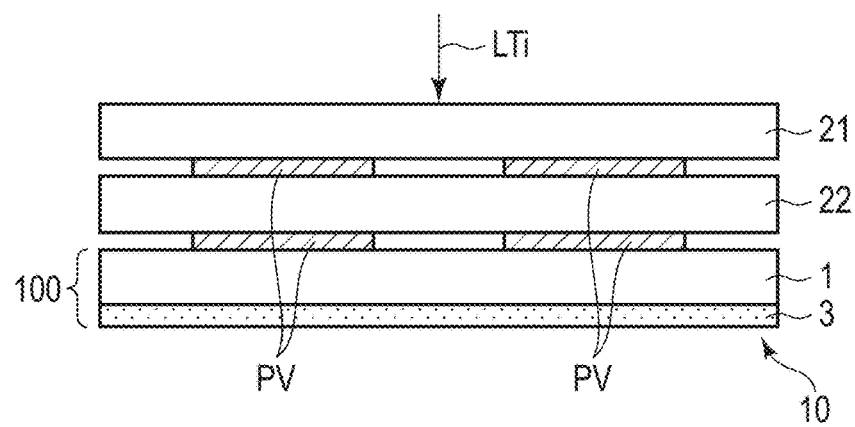
FIG. 16 is a diagram showing a variation of the photovoltaic cell device 10.

In the example shown in FIG. 15, the structural elements of the photovoltaic cell device 10 are identical to those of the example shown in FIG. 14, whereas the transparent substrate 1 of the liquid crystal optical element 100 faces the side on which light LTi is incident. The photovoltaic cells PV are located between the liquid crystal layer 3 and the protective substrate 21, and are also located between the protective substrate 21 and the protective substrate 22.

In this example, too, the same advantage as that of the example shown in FIG. 14 can be achieved. In the example shown in FIG. 16, the structural elements of the photovoltaic cell device 10 are identical to those of the example shown in FIG. 14, whereas the protective substrate 21 faces the side on which light LTi is incident. The protective substrate 22 is located between the protective substrate 21 and the liquid crystal optical element 100. The photovoltaic cells PV are located between the protective substrate 21 and the protective substrate 22, and are also located between the protective substrate 22 and the transparent substrate 1.

In this example, too, the same advantage as that of the example shown in FIG. 14 can be achieved.

Figure 17:
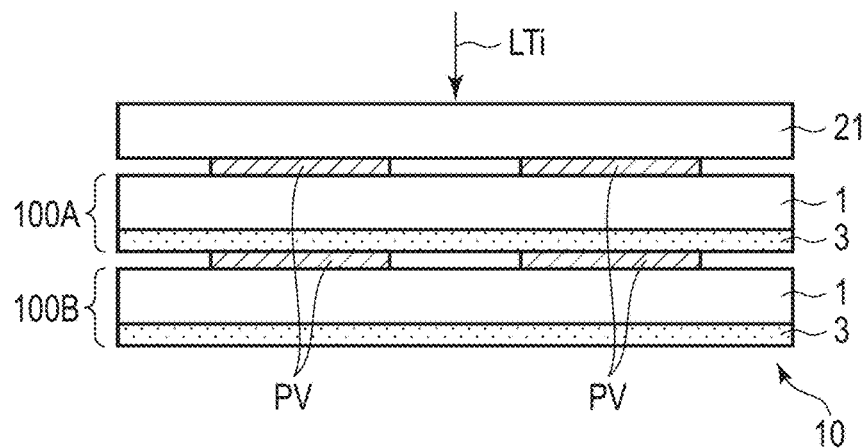
FIG. 17 is a diagram showing a variation of the photovoltaic cell device 10.

In the example shown in FIG. 17, the photovoltaic cell device 10 comprises two liquid crystal optical elements 100A and 100B and the protective substrate 21. The liquid crystal optical element 100A is located between the protective substrate 21 and the liquid crystal optical element 100B. The liquid crystal optical elements 100A and 100B have the same structure, and each comprise a transparent substrate 1 and a liquid crystal layer 3. The protective substrate 21 faces the side on which light LTi is incident. The photovoltaic cells PV are located between the protective substrate 21 and the transparent substrate 1 of the liquid crystal optical element 100A, and are also located between the liquid crystal layer 3 of the liquid crystal optical element 100A and the transparent substrate 1 of the liquid crystal optical element 100B.

In this example, too, the same advantage as that of the example shown in FIG. 14 can be achieved.

Figure 18:
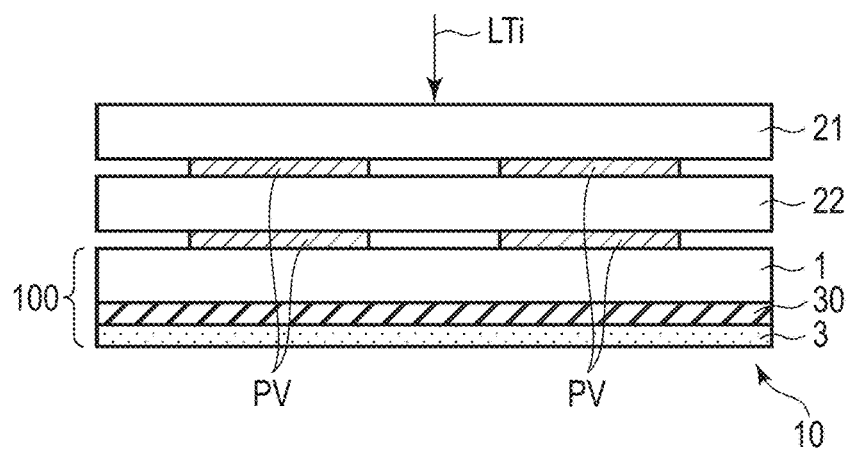
FIG. 18 is a diagram showing a variation of the photovoltaic cell device 10.

In the example shown in FIG. 18, the photovoltaic cell device 10 comprises the liquid crystal optical element 100, the photovoltaic cells PV, the protective substrate 21, and the protective substrate 22. The protective substrate 21 faces the side on which light LTi is incident. The protective substrate 22 is located between the protective substrate 21 and the liquid crystal optical element 100. The photovoltaic cells PV are located between the protective substrate 21 and the protective substrate 22, and are also located between the protective substrate 22 and the transparent substrate 1. In the liquid crystal optical element 100, the liquid crystal layer 3 is formed on a support body 30, and the support body 30 is attached to the transparent substrate 1.

In this example, too, the same advantage as that of the example shown in FIG. 14 can be achieved.

The disposition of the liquid crystal layer 3 is not limited to the examples shown in FIG. 14 to FIG. 18, and the liquid crystal layer 3 may be disposed on each main surface of the protective substrates 21 and 22.

Variations of the liquid crystal optical element 100 will be described next with reference to FIG. 19 to FIG. 22.

Figure 19:
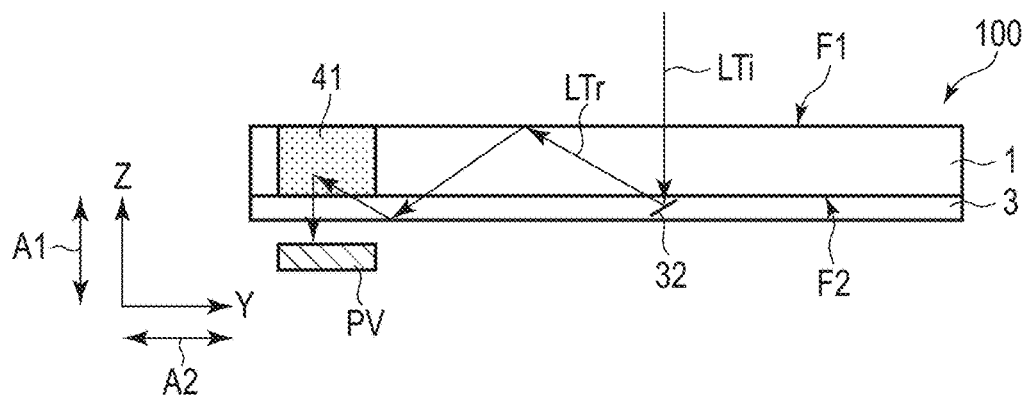
FIG. 19 is a diagram showing a variation of the liquid crystal optical element 100.

In the example shown in FIG. 19, the transparent substrate 1 includes a light scatterer 41 disposed locally. The light scatterer 41 scatters light of the wavelength λ used for power generation in a photovoltaic cell PV. For example, as the light scatterer 41, one that transmits visible light and scatters infrared rays can be applied.

The photovoltaic cell PV is opposed to the light scatterer 41 in the first direction A1. In the example shown in the figure, the photovoltaic cell PV is disposed on the second main surface F2 side of the transparent substrate 1 and is opposed to the light scatterer 41 with the liquid crystal layer 3 interposed therebetween. The photovoltaic cell PV may be disposed on the first main surface F1 side.

In this example, light LTi incident on the liquid crystal optical element 100 is reflected repeatedly and is scattered by the light scatterer 41. The photovoltaic cell PV generates power, receiving part of light scattered by the light scatterer 41.

Figure 20:
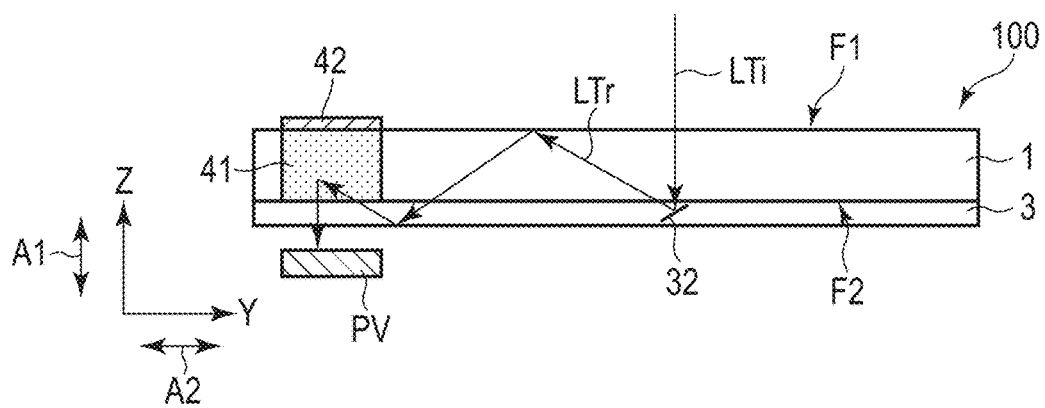
FIG. 20 is a diagram showing a variation of the liquid crystal optical element 100.

In the example shown in FIG. 20, the liquid crystal optical element 100 further comprises a light reflector 42. The light reflector 42 is opposed to the light scatterer 41 in the first direction A1. The light scatterer 41 is located between the photovoltaic cell PV and the light reflector 42. In the example shown in the figure, the light reflector 42 is disposed on the first main surface F1.

In this example, light scattered by the light scatterer 41 is reflected by the light reflector 42 toward the photovoltaic cell PV. Thus, the power generation efficiency improves as compared to that in the example shown in FIG. 19.

Figure 21:
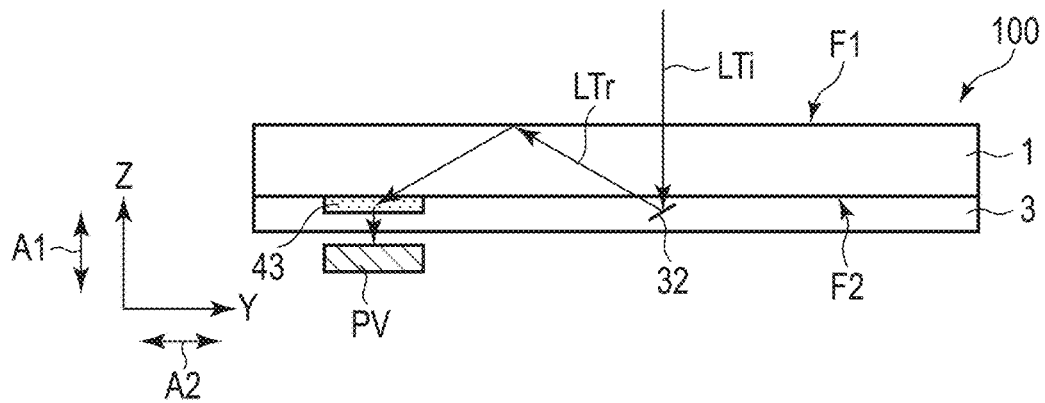
FIG. 21 is a diagram showing a variation of the liquid crystal optical element 100.

In the example shown in FIG. 21, the liquid crystal optical element 100 further comprises a light scatterer 43. The light scatterer 43 is disposed locally on the second main surface F2, and is covered by the liquid crystal layer 3. The photovoltaic cell PV is opposed to the light scatterer 43 with the liquid crystal layer 3 therebetween in the first direction A1.

In this example, too, the photovoltaic cell PV generates power, receiving part of light scattered by the light scatterer 43.

Figure 22:
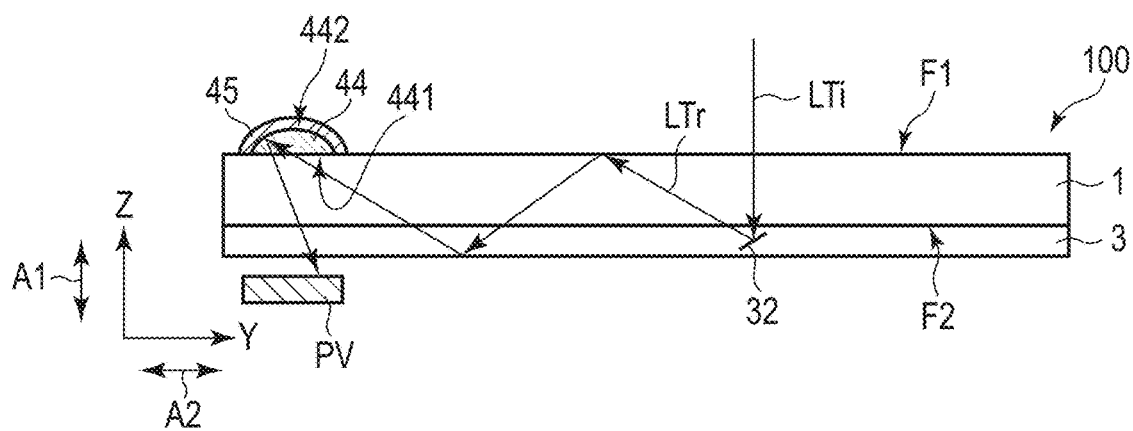
FIG. 22 is a diagram showing a variation of the liquid crystal optical element 100.

In the example shown in FIG. 22, the liquid crystal optical element 100 further comprises a transparent member 44 and a reflective film 45. The transparent member 44 comprises a flat surface 441 which contacts the first main surface F1 and a convex curved surface 442 which is opposed to the flat surface 441. It is preferable that the transparent member 44 have a refractive index equal to that of the transparent substrate 1. The reflective film 45 covers the curved surface 442.

The photovoltaic cell PV is opposed to the transparent member 44 in the first direction A1. In the example shown in the figure, the photovoltaic cell PV is disposed on the second main surface F2 side of the transparent substrate 1, and is opposed to the transparent member 44 with the transparent substrate 1 and the liquid crystal layer 3 interposed therebetween.

In this example, light LTi incident on the liquid crystal optical element 100 is reflected repeatedly, then guided by the transparent member 44, and reflected by the reflective film 45. The photovoltaic cell PV generates power, receiving light reflected by the reflective film 45.

A method of placing the photovoltaic cells PV on the liquid crystal optical element 100 will be described next.

Figure 23:
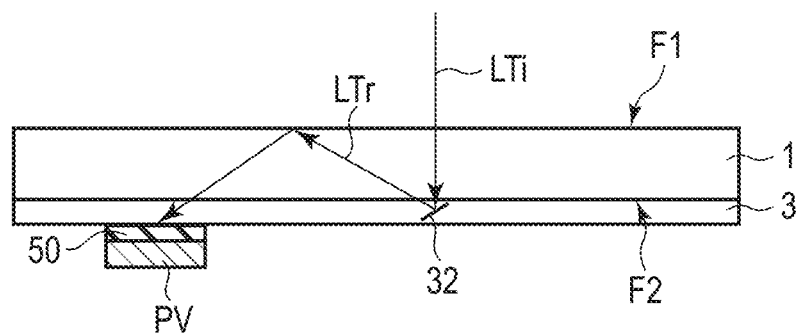
FIG. 23 is a diagram showing an example of the placement of a photovoltaic cell PV on the liquid crystal optical element 100.

FIG. 23 is a diagram showing an example of the placement of a photovoltaic cell PV on the liquid crystal optical element 100.

In the example shown in the figure, the photovoltaic cell PV is, for example, a silicon photovoltaic cell, and has been formed separately from the liquid crystal optical element 100. The photovoltaic cell PV is attached to the liquid crystal optical element 100 with transparent adhesive 50. In the example shown in the figure, the photovoltaic cell PV is attached to the liquid crystal layer 3 with the adhesive 50. The photovoltaic cell PV may be attached to the first main surface F1 of the transparent substrate 1 with adhesive.

Figure 24:
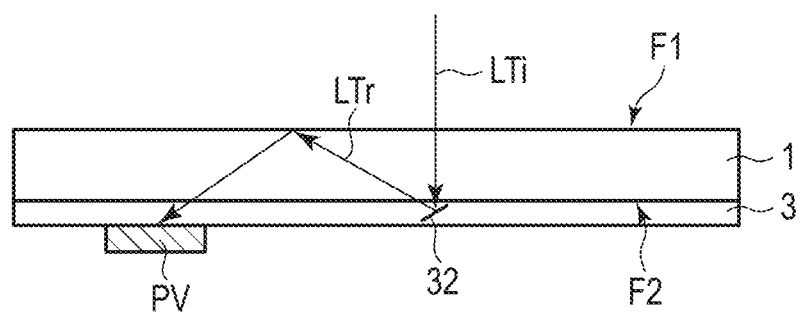
FIG. 24 is a diagram showing another example of the placement of the photovoltaic cell PV on the liquid crystal optical element 100.

FIG. 24 is a diagram showing another example of the placement of the photovoltaic cell PV on the liquid crystal optical element 100.

In the example shown in the figure, the photovoltaic cell PV is, for example, an organic thin-film photovoltaic cell, and has been formed by applying a material to the liquid crystal optical element 100. In the example shown in the figure, the photovoltaic cell PV is directly formed on the surface of the liquid crystal layer 3. The photovoltaic cell PV may be directly formed on the first main surface F1 of the transparent substrate 1.

As described above, according to the present embodiment, a photovoltaic cell device which can suppress a loss when guiding light can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A photovoltaic cell device comprising:
a transparent substrate comprising a first main surface and a second main surface opposed to the first main surface;
a liquid crystal layer disposed on the second main surface side of the transparent substrate and comprising a cholesteric liquid crystal including liquid crystal molecules; and
photovoltaic cells disposed on at least one of the first main surface side and the second main surface side of the transparent substrate in a first direction, each formed into a strip shape, and arranged with a gap along the first direction between the photovoltaic cells, wherein
a width in the first direction of each of the photovoltaic cells is less than the gap,
the first direction is a short-side direction of the photovoltaic cells,
the liquid crystal layer is cured in a state where alignment directions of the liquid crystal molecules are fixed,
in the liquid crystal layer, the cholesteric liquid crystal comprises a reflective surface configured to reflect circularly polarized light, and the reflective surface is inclined with respect to the second main surface of the transparent substrate.

2. The photovoltaic cell device of claim 1, wherein alignment directions of the liquid crystal molecules arranged in the short-side direction of the photovoltaic cells are different from each other, and alignment directions of the liquid crystal molecules arranged in a long-side direction of the photovoltaic cells are substantially identical.

3. The photovoltaic cell device of claim 1, wherein the photovoltaic cells are silicon photovoltaic cells.

4. The photovoltaic cell device of claim 1, wherein the photovoltaic cells are organic thin-film photovoltaic cells.

5. The photovoltaic cell device of claim 1, wherein the photovoltaic cells disposed on the second main surface side of the transparent substrate are in contact with liquid crystal layer.

6. The photovoltaic cell device of claim 1, wherein the liquid crystal layer is in contact with the transparent substrate.

7. The photovoltaic cell device of claim 6, wherein no electrodes for forming an electric field in the liquid crystal layer are interposed between the transparent substrate and the liquid crystal layer.

* * * * *